(12) United States Patent
Walker et al.

(10) Patent No.: US 8,785,897 B2
(45) Date of Patent: Jul. 22, 2014

(54) MONOLITHIC OPTO-ISOLATORS

(75) Inventors: Harold Young Walker, Plano, TX (US); James D. Guenter, Garland, TX (US); Gary Landry, Allen, TX (US); Jimmy A. Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 1621 days.

(21) Appl. No.: 11/850,578

(22) Filed: Sep. 5, 2007

(65) Prior Publication Data

US 2009/0059987 A1    Mar. 5, 2009

(51) Int. Cl.
*H04B 10/80*    (2013.01)
*H01S 5/026*    (2006.01)
*H01S 5/02*    (2006.01)
*H01S 5/00*    (2006.01)
*H01S 5/022*    (2006.01)

(52) U.S. Cl.
CPC .......... *H04B 10/802* (2013.01); *H01S 5/02292* (2013.01); *H01S 5/0262* (2013.01); *H01S 5/0071* (2013.01)
USPC ........................ 250/551; 372/50.1; 372/108

(58) Field of Classification Search
CPC . H01S 5/02292; H01S 5/0262; H01S 5/0071; H04B 10/802
USPC .................................... 372/50.1, 108; 250/551
See application file for complete search history.

(56) References Cited

U.S. PATENT DOCUMENTS

| | | | | |
|---|---|---|---|---|
| 6,111,903 A | * | 8/2000 | Isaksson et al. | 372/50.21 |
| 6,246,123 B1 | * | 6/2001 | Landers et al. | 257/787 |
| 6,393,183 B1 | * | 5/2002 | Worley | 385/39 |
| 7,659,531 B2 | * | 2/2010 | Choi et al. | 250/551 |
| 7,835,410 B2 | * | 11/2010 | Guenter et al. | 372/29.01 |

* cited by examiner

*Primary Examiner* — Jessica Stultz
*Assistant Examiner* — Marcia Golub-Miller
(74) *Attorney, Agent, or Firm* — Maschoff Brennan

(57) ABSTRACT

Monolithic opto-isolators and arrays of monolithic opto-isolators are disclosed. The monolithic opto-isolators are manufactured in a single semiconductor wafer where they may be tested at the wafer level before each opto-isolator is singulated from the wafer. The monolithic opto-isolators include a VCSEL monolithically produced adjacent to a photodiode where an axis of optical signal transmission of the VCSEL is substantially parallel to an axis of optical signal reception by the photodiode.

22 Claims, 13 Drawing Sheets

MONOLITHIC OPTO-ISOLATORS

CROSS-REFERENCE TO RELATED APPLICATIONS

Not applicable.

BACKGROUND

A device referred to as an opto-isolator (also referred to as an optical isolator, optocoupler and photocoupler) is often used to reduce noise and prevent other deleterious effects in electrical circuits. For example, at least some of the electronic noise typically derives from back end digital signal processing which is deleterious to the performance of analog integrated circuits. In addition, an opto-isolator is often used to reduce ground loops and ground noise spikes in electronic circuitry; and to isolate circuitry due to incompatible, dangerous, or otherwise deleterious voltage regimes, such as to isolate high voltage networks from low voltage electronics. Thus, opto-isolators are used for various reasons in modern electronic circuit design.

Opto-isolators electrically isolate portions of a circuit thereby reducing noise. An opto-isolator uses a short optical transmission path to transfer a signal between elements of a circuit, typically a LED and an optical receiver, while keeping them electrically isolated. The LED and optical receiver are separated so that light may travel across a barrier but electrical current may not. When an electrical signal is applied to the input of the opto-isolator, the LED generates a light signal, and an optical receiver generates a corresponding electrical signal as the output. When a photodiode is used as the optical receiver, the output current is proportional to the amount of incident light supplied by the LED. The ratio of the amount of current output by the photodiode to the amount of current input to the LED is referred to as the current transfer ratio.

Conventional embodiments utilizing LEDs have been limited, however, to low speed opto-isolation applications because they are limited by the response time of the LED. These conventional embodiments have also been limited in their current transfer ratio due to high power dissipation of LED emitters. Moreover, conventional embodiments have been bulky and prone to optical misalignment of the optical emitter and optical receiver. The subject matter claimed herein is not limited to embodiments that solve any disadvantages or that operate only in environments such as those described above. Rather, this background is only provided to illustrate an example of technology areas where some embodiments may be practiced.

BRIEF SUMMARY OF SEVERAL EXAMPLE EMBODIMENTS

An opto-isolator is disclosed. The opto-isolator includes a vertical cavity surface emitting laser (VCSEL) diode comprising a first PN junction with a first p layer and a first n layer. The opto-isolator further includes a photodiode monolithically disposed adjacent to the VCSEL. The opto-isolator further includes at least one reflective surface configured to optically couple the VCSEL with the photodiode.

A method for manufacturing an opto-isolator is disclosed. The method includes producing a VCSEL on a wafer and producing a photodiode on the wafer adjacent to the VCSEL. The method further includes producing at least one reflective surface above the wafer. The reflective surface is configured to optically couple the VCSEL with the photodiode. The method further includes singulating the VCSEL, photodiode, and the at least one reflective surface from the rest of the wafer.

An array of opto-isolators is disclosed. The array of opto-isolators includes an array of VCSEL diodes, an array of photodiodes monolithically disposed adjacent to the VCSEL, and a plurality of reflective surfaces. An axis of transmission of the VCSEL is parallel to an axis of reception of the photodiode. Each reflective surface is configured to optically couple a VCSEL with a corresponding photodiode.

These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SEVERAL EMBODIMENTS

The present invention relates to monolithic opto-isolators. Several of the embodiments disclosed herein relate to opto-isolators having increased speed capabilities, lower power dissipation, simplified design, simplified manufacture, smaller footprint, lower cost, more robust construction, and/or better current transfer ratio as compared to conventional opto-isolators. In particular, several opto-isolators disclosed herein may be particularly advantageous in certain applications, such as high-speed optical communications, testing equipment (such as high speed oscilloscopes), computing, radio, wireless connections, as well as many other applications. Some embodiments disclosed herein may have improved performance characteristics, such as improved response time enabling high-speed applications and/or improved current transfer ratio, as well as other improvements.

As a monolithic chip, electrical and optical parameters of the opto-isolator can be tested in wafer form in some embodiments. Assembly and final test can also be very simple operations. The opto-isolators can be placed in an open cavity package and then encased within a TO package, ceramic package, or within a molded leadframe package, for example. According to several embodiments, however, a simple flat lid may be used for packaging. Also, if reflecting surfaces of the monolithic opto-isolators are plated with a metal (such as gold, aluminum, etc.), the opto-isolator can be overmolded on a leadframe similar to a standard IC chip. Thus, the embodiments disclosed herein may enable many advantages in manufacture, testing, and packaging options as well.

Opto-isolators disclosed herein can include VCSELs as the optical emitter. VCSELs have a laser resonator that includes two distributed Bragg reflector (DBR) mirrors parallel to the wafer surface. VCSELs also typically include an active region between the DBR mirrors and comprise one or more quantum wells for light generation. The DBR-mirrors include layers with alternating high and low refractive indices. Each layer typically has a thickness of a quarter of the laser wavelength in the material. The upper and lower DBR mirrors are typically doped as p-type and n-type materials, forming a diode junction. In more complex VCSEL structures, the p-type and n-type regions may be buried between the mirrors. VCSELs for wavelengths from 650 nm to 1300 nm, for example, can be based on gallium arsenide (GaAs) wafers with DBRs formed from GaAs and aluminum gallium arsenide (AlGaAs).

According to the teachings herein, a VCSEL can be monolithically manufactured at the wafer level along with a detector, such as a photodiode. As discussed below, the VCSEL and optical detector can be produced by growing the VCSEL and/or optical detector on the same substrate or each element may be placed on a substrate through a variety of processes, such as wafer bonding, and need not necessarily be planar.

Figure 1A:
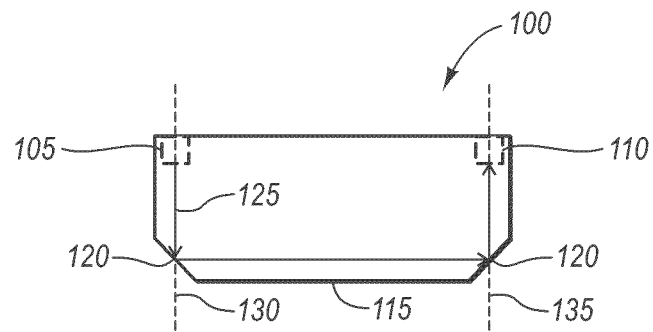
FIGS. 1A, 1B, and 1C disclose a monolithic opto-isolator.
Figure 1B:
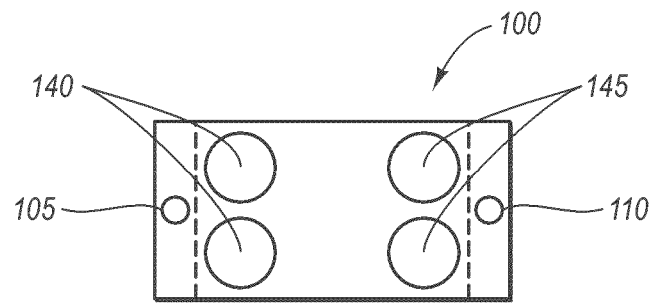
Figure 1C:
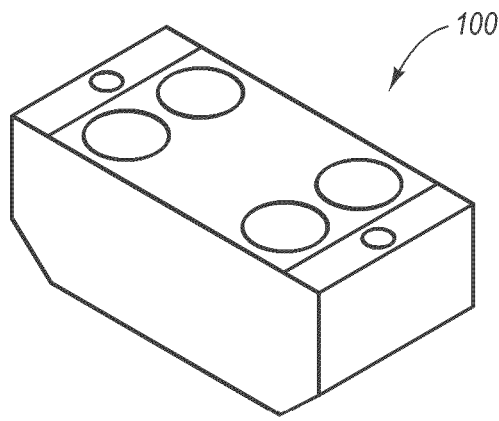

For example, referring to FIGS. 1A, 1B, and 1C, a monolithic opto-isolator 100 is illustrated which includes both an optical emitter 105, such as a VCSEL, and an optical detector 110, such as a PIN photodiode. According to this embodiment, the optocoupling is accomplished by reflective surfaces 120 along a first surface 115. The reflective surfaces 120 are angled about 45 degrees to an axis of transmission 130 and an axis of reception 135 respectively to provide internal light reflection through the material of the opto-isolator 100. The opto-isolator 100 can include a polymer or an optically transmissive semiconductor layer for transmission of an optical signal 125 through the material of the opto-isolator 100. The 45 degree reflective surfaces 120 can be formed by etching (for example by using a gray scale mask or other method), laser ablation, soft forming (for example using a hard tool to stamp a soft material before cure), or by a number of other methods. The opto-isolator 100 further includes transmitter bond pads 140 and detector bond pads 145 for providing current to the VCSEL and photodiode respectively.

While the bond pads 140 are illustrated as being disposed on a first side of the opto-isolator along with the optical emitter 105 and optical detector 110, the location of the bond pads 140, optical emitter 105 and optical detector 110 may be reversed, or otherwise changed from that shown in the figures herein so long as the function of the opto-isolators is substantially retained. Thus, in this embodiment, light 125 can be emitted toward the first surface 115 of the opto-isolator 100.

Figure 2A:
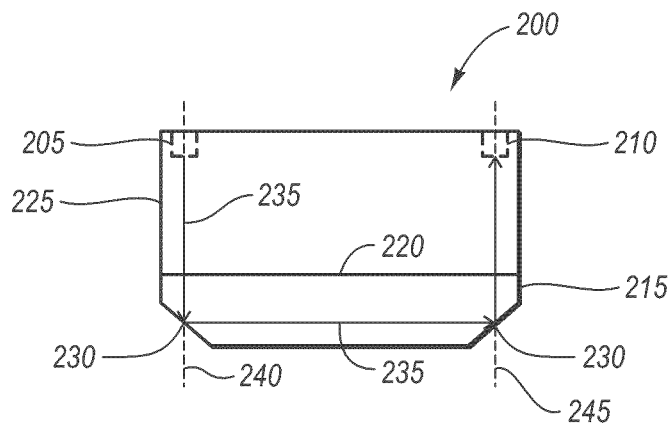
FIGS. 2A, 2B, and 2C disclose a monolithic opto-isolator.
Figure 2B:
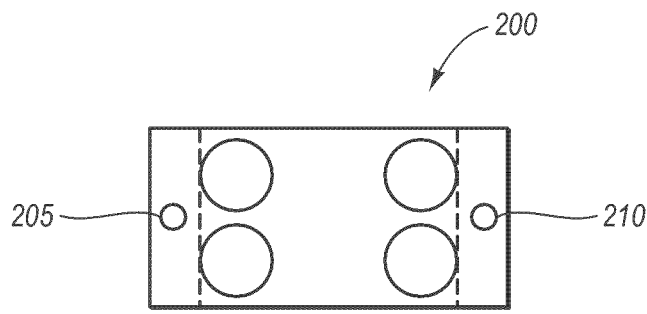
Figure 2C:
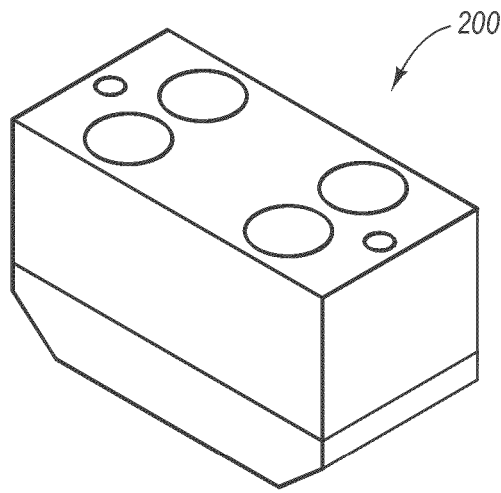

Referring to FIGS. 2A, 2B, and 2C, a monolithic opto-isolator 200 that contains both an optical emitter 205, such as a VCSEL, and a detector 210, such as a PIN photodiode, is illustrated where an additional layer 215 is attached to a first surface 220 of a chip 225 to provide the internal reflection.

According to this embodiment, the additional layer 215 is die attached to the first surface 220 of the chip 225 and is etched to include reflection surfaces 230 intersecting both an axis of transmission 240 and an axis of reception 245 to optimize the internal reflection of the optical output 235 from the optical emitter 205 to the optical detector 210. The internal reflecting surfaces 230 may be configured to reflect the optical signal 235 through material or at least partially through air.

Figure 3A:
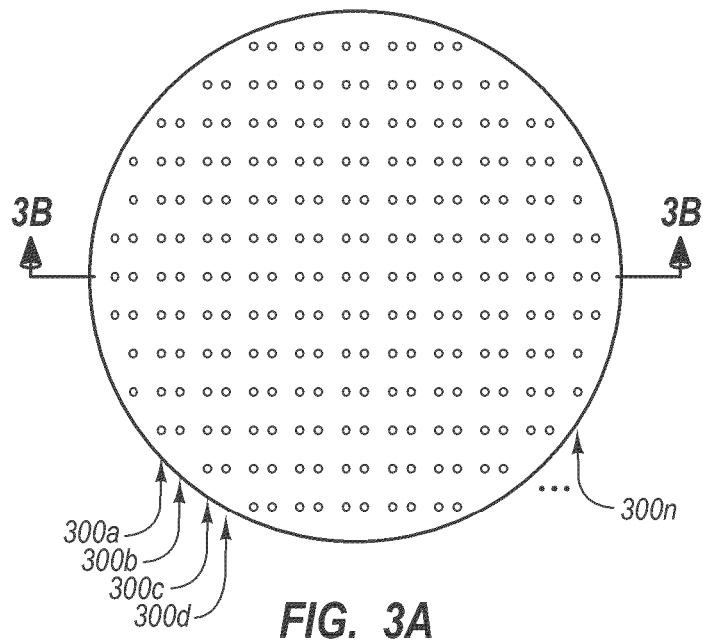
FIGS. 3A, 3B, 3C, and 3D disclose a method for manufacturing and testing an opto-isolator.

The embodiments disclosed herein can be manufactured, and in some cases tested, at the wafer level. For example, referring to FIGS. 3A, 3B, 3C, and 3D a method for manufacturing and testing an opto-isolator is illustrated. In FIG. 3A a wafer is illustrated. The wafer includes rows 300a-n of emitters and detectors monolithically produced on the same wafer. The order in which the rows 300a-n of emitters and detectors are produced can be varied so long as each opto-isolator singulated from the wafer includes one or more corresponding emitters and detectors for opto-coupling.

In one example, the rows 300a-n can alternate between a row of optical emitters and a row of optical receivers. For example, row 300a can include optical emitters, row 300b can include optical receivers, row 300c can include optical emitters, and row 300d can include optical receivers, and so on. In other embodiments, the rows can have two adjacent rows of optical emitters and two alternating adjacent rows of optical receivers. For example, row 300a can be a row of optical emitters, rows 300b and 300c can be rows of optical receivers, row 300d can be a row of optical emitters, and so on to row 300n.

The wafer can include any number of rows of emitters and receivers. For example, the wafer can include tens, hundreds, thousands, or more rows of optical emitters and optical receivers, each optical emitter and optical receiver pair corresponding to a monolithic opto-isolator.

Moreover, the wafer can include alternating optical emitters and detectors in both directions across the wafer. In this manner, a bidirectional opto-isolator array may be manufactured where two or more opto-isolators are disposed side-by-side, but an optical receiver of a first opto-isolator is disposed adjacent to an optical emitter of a second opto-isolator and an optical emitter of the first opto-isolator is disposed adjacent to an optical receiver of the second opto-isolator. Thus, the first and second opto-isolators are disposed on a single chip but transmit optical signals in opposite directions to create a bi-directional opto-isolator array in a single chip.

Figure 3B:
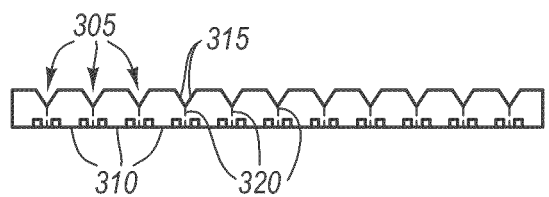

FIG. 3b illustrates a side view taken through line 3B of FIG. 3A. FIG. 3B illustrates the location of etched trenches 305 forming the reflective surfaces for each opto-isolator 310. As shown the etched trenches 305 are created by an anisotropic etching process to create grooves having two 45 degree reflective surfaces 315 for each opto-isolator 310. FIG. 3B also shows dotted lines 320 at locations where the opto-isolators 310 are later diced to singulate the opto-isolators 310 from the rest of the wafer.

Figure 3C:
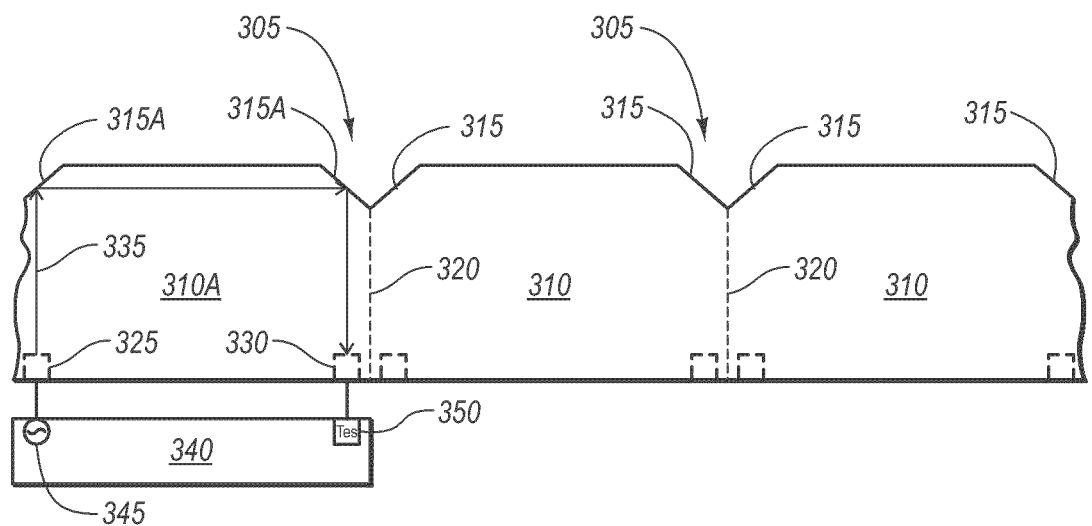

FIG. 3C illustrates testing of an opto-isolator 310A at the wafer level. As shown, the opto-isolator 310A includes an emitter 325 and receiver 330. The opto-isolator 310A also includes two reflective surfaces 315A for internally reflecting an optical signal 335 generated by the optical emitter 325 and received by the optical receiver 330. A test device 340 includes a current source 345 for providing a current to the optical emitter 325 and a device 350 for receiving an electrical signal from the optical receiver 330. The electrical signal received from the optical receiver 330 is analyzed to determine if the opto-isolator 310A meets a performance parameter. Each opto-isolator 310 can be tested at the wafer level simultaneously, in succession, or in any order. Thus, an opto-isolator 310 that does not meet a performance parameter requirement can be identified and discarded prior to additional manufacturing steps or packaging.

Figure 3D:
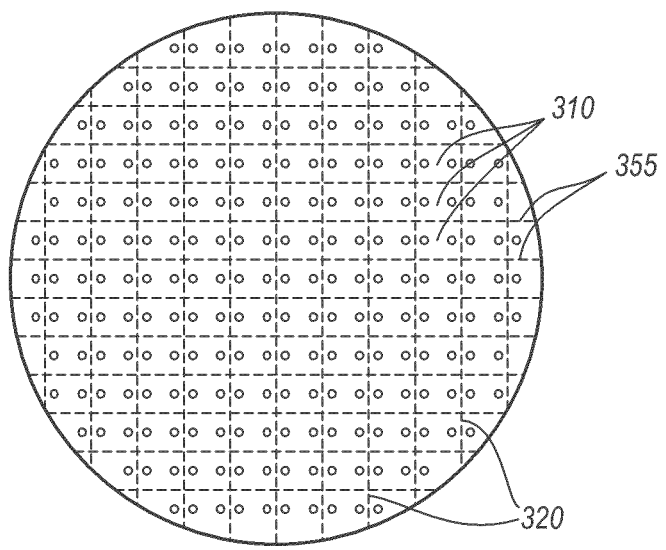

FIG. 3D includes dashed lines 355 illustrating the locations where the wafer is diced to singulate each opto-isolator 310. Thus, each opto-isolator 310 is singulated from the wafer by dicing the wafer down the middle of each etched groove as shown in FIGS. 3B, 3C, and 3D by dotted lines 320, and also between each opto-isolator as shown in FIG. 3D by dotted lines 355.

Figure 4A:
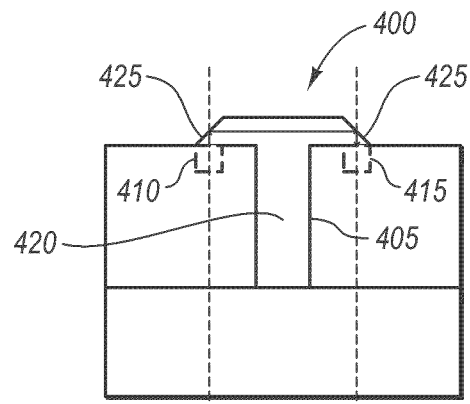
FIGS. 4A, 4B, and 4C disclose a monolithic opto-isolator.
Figure 4B:
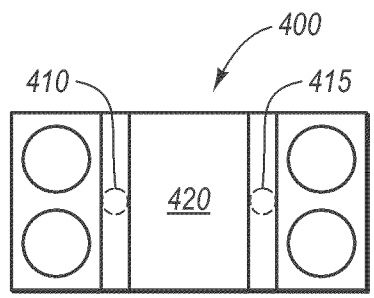
Figure 4C:
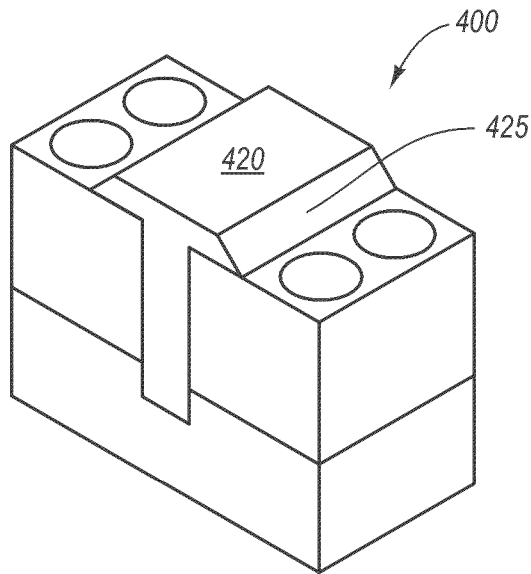

FIGS. 4A, 4B, and 4C illustrate a monolithic opto-isolator 400 including a trench 405 disposed between an optical emitter 410 and an optical detector 415. The trench 405 may be produced by a removal process, such as a saw cut, which removes material of the wafer between the optical emitter 410 and optical detector 415 to further electrically isolate the optical emitter 410 and optical detector 415. In some embodiments, the trench 405 is not necessary, however, and the opto-isolator 400 may be manufactured without the trench 405 according to some embodiments. The trench 405 may, however, improve optical isolation between the optical emitter 410 and the optical detector 415. The trench 405 is filled with a material 420 which extends above and beyond the trench 405 and includes internal reflecting surfaces 425. For example, the material 420 can be an optically translucent material having an index of refraction about equal to the GaAs wafer from which the opto-isolator 400 is produced thereby allowing for light to optically couple into the material 420.

Figure 4D:
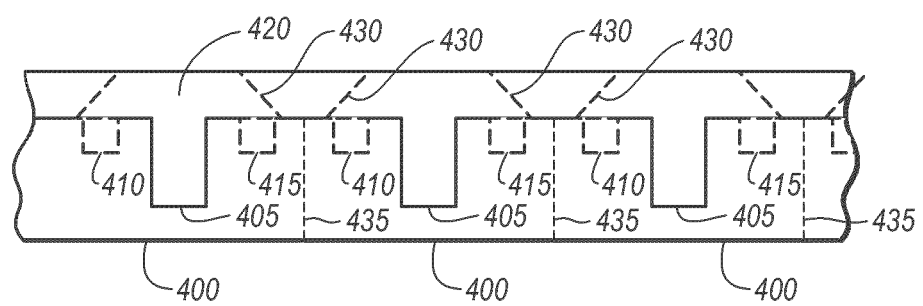
FIG. 4D discloses a method for manufacturing the monolithic opto-isolator of FIGS. 4A, 4B, and 4C.

FIG. 4D illustrates a manner in which the opto-isolator 400 of FIGS. 4A, 4B, and 4C can be manufactured. As shown in FIG. 4D, multiple optical isolators 400 are manufactured at the wafer level. Each opto-isolator 400 includes an optical transmitter 410 and an optical receiver 415. A trench 405 is produced between the optical transmitter 410 and the optical receiver 415 of each opto-isolator 400. The trench 400 is filled with material 420 having an index of refraction about equal to the index of refraction of the wafer. The material 420 forms a layer over the top of the wafer, which is subsequently etched at dotted lines 430 to produce the internal reflective surfaces 425 (see FIG. 4A). Subsequently each opto-isolator 400 is singulated from the wafer by dicing the wafer at dotted lines 435.

As discussed above with regard to FIG. 3D, each opto-isolator 400 may be tested at the wafer level prior to singulation. The internal reflecting surfaces 425 can also be coated with a metallic material to improve reflection and enable additional packaging options. The material 420 can include a polymer material. The polymer material can be selected based on electrical isolation characteristics, optical characteristics, and the polymer's ability to fill the trenches 405 and provide the top coat for the reflective surfaces 425. The material 420 can also be applied by a photolithographic process in combination with an etching process to create the internal reflecting surfaces 425.

Figure 5A:
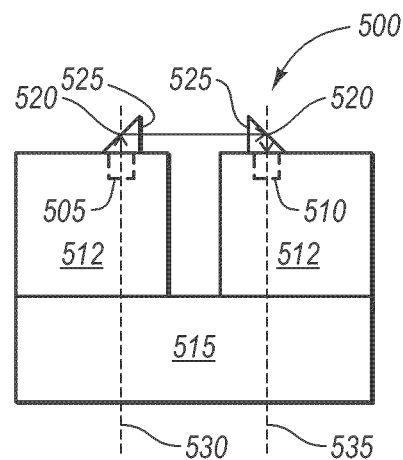
FIGS. 5A, 5B, and 5C disclose a monolithic opto-isolator.
Figure 5B:
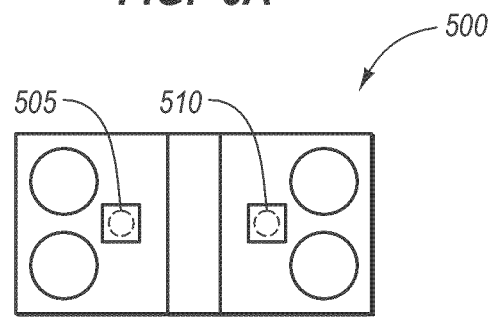
Figure 5C:
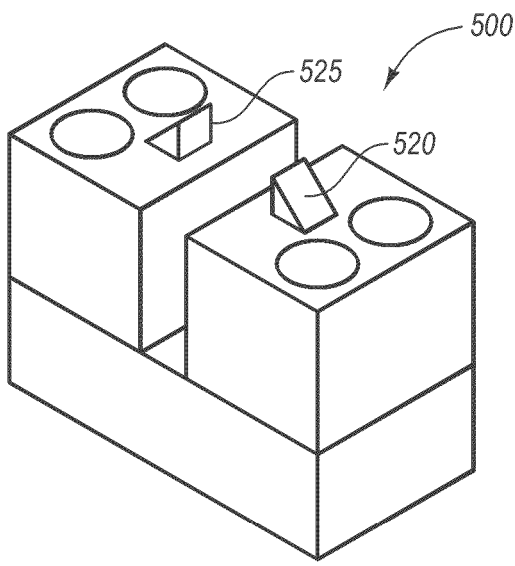

FIGS. 5A, 5B, and 5C illustrate a monolithic opto-isolator 500 including an optical emitter 505 and an optical receiver 510 each grown on a separate die 512 and supported by an insulating substrate 515. In this embodiment the internal reflecting surfaces 520 are configured to reflect the optical signal at least partially through a gap of air between posts 525 which include the internal reflecting surfaces 520. The posts 525 can be created using a deposition and anisotropic etching process, or the posts 525 can be created separate from the die 512 and attached to the die 512 using a wafer bonding process. The posts 525 are disposed along an axis of transmission 530 and an axis of reception 535.

Figure 6A:
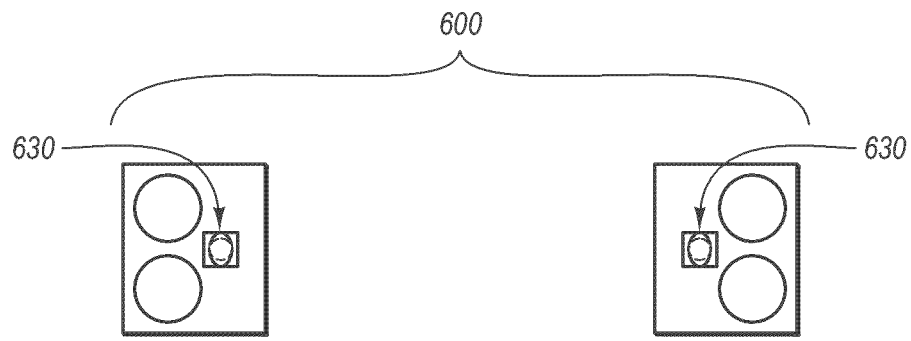
FIGS. 6A, 6B, and 6C disclose a monolithic opto-isolator.
Figure 6B:
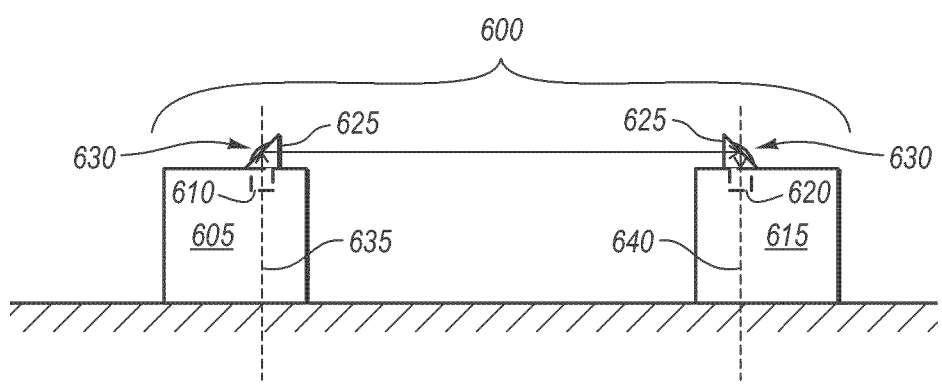
Figure 6C:
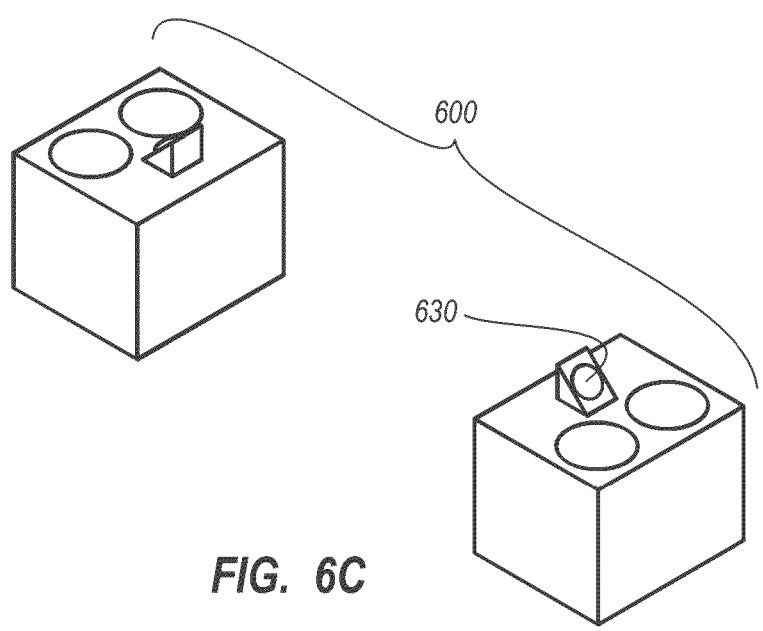

A lens can be produced on the reflective surfaces of the embodiments disclosed herein to focus the light as it is redirected from the axis of transmission of the optical transmitter to the axis of reception of the optical receiver. For example, FIGS. 6A, 6B, and 6C illustrate an embodiment similar to FIGS. 5A, 5B, and 5C in that the opto-isolater 600 includes a first die 605 including an optical transmitter 610, a second die 615 including an optical receiver 620 and posts 625 including reflecting surfaces 630, except that each reflecting surface 630 includes a lens for collimating, conditioning, and/or directing light from an axis of transmission 635 of the optical transmitter 610 to an axis of reception 640 of the optical receiver 620. Thus, the reflective surfaces disclosed herein can include a lens for conditioning or directing light as it is coupled from the optical emitter to the optical receiver. Discussion of suitable post-lens configurations are further disclosed in U.S. Patent Application Publication 2006/0227844 to James K. Guenter, entitled "ON-CHIP LENSES FOR DIVERTING VERTICAL CAVITY SURFACE EMITTING LASER BEAMS", the contents of which are hereby incorporated by reference herein.

Figure 7A:
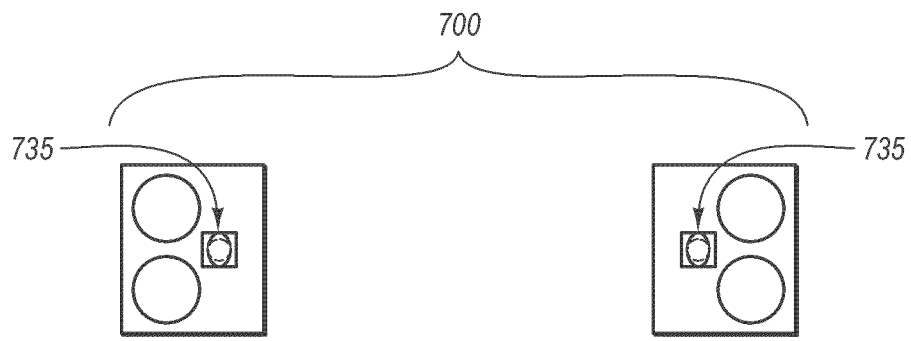
FIGS. 7A, 7B, and 7C disclose a monolithic opto-isolator.
Figure 7B:
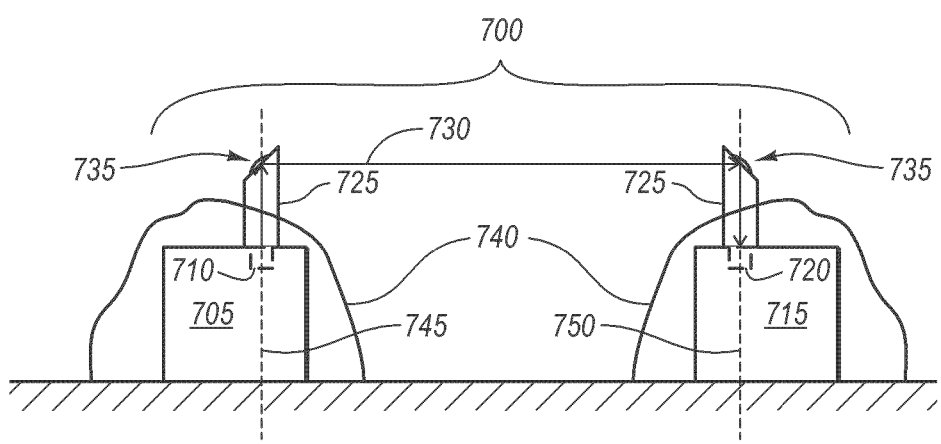
Figure 7C:
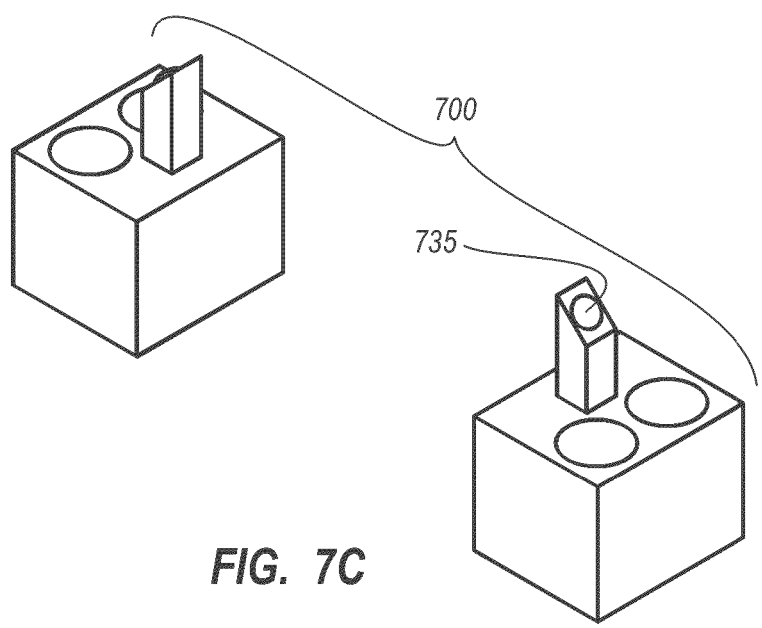

Referring to FIGS. 7A, 7B, and 7C, an opto-isolator 700 is illustrated which is similar to the opto-isolators of FIGS. 5 and 6 in that the opto-isolator 700 includes a first die 705 that includes an optical emitter 710 and a second die 715 that includes an optical receiver 720. Further, each die 705 and 715 includes a post 725 through which an optical signal 730 is transmitted and redirected by a reflective surface 735. However, in FIG. 7 the length of each post 725 is extended along an axis of transmission 745 and an axis of reception 750, and a coating 740 is applied at least partially around each die 705 and 715 to further electrically isolate the dies 705 and 715.

Figure 8:
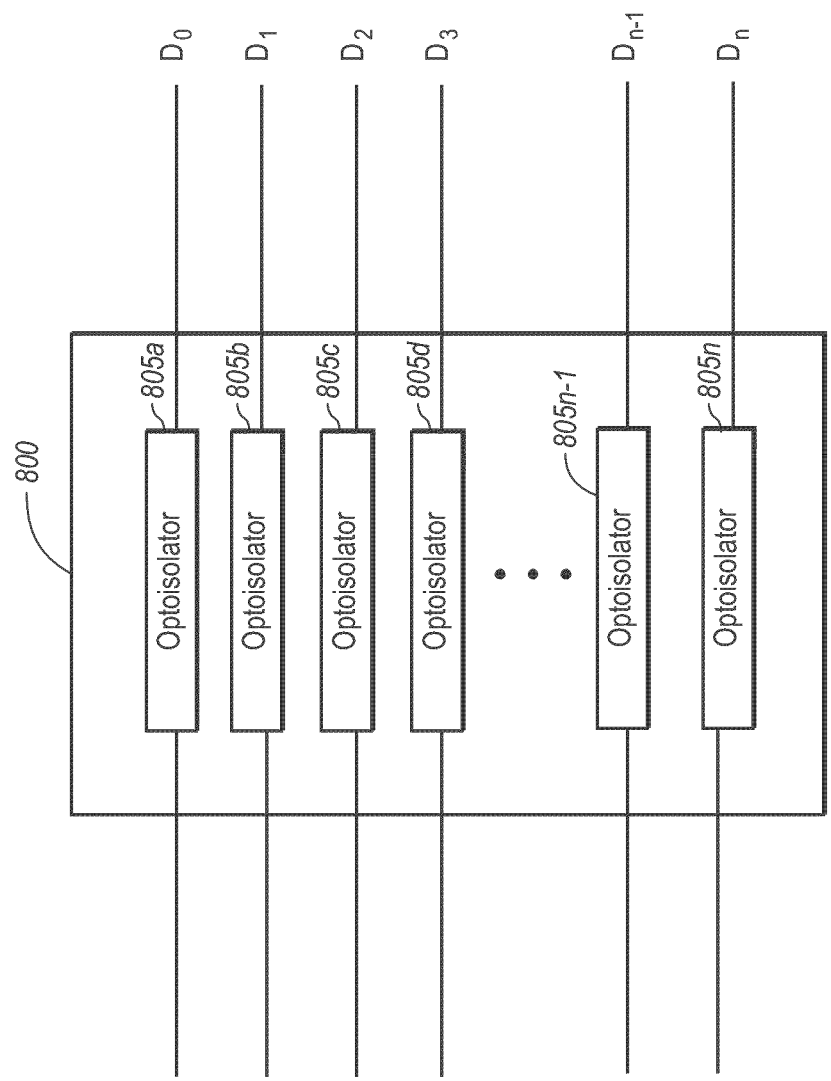
FIG. 8 discloses an opto-isolator array.

Referring to FIG. 8, an opto-isolator array 800 is shown. The opto-isolator array 800 can be an array of distinct opto-isolator chips 805a-n according to any of the embodiments disclosed above, or the opto-isolator array 800 can be an array of opto-isolators 805a-n manufactured monolithically from the same wafer. Thus, the opto-isolator array 800 can receive each input of a data bus without the need for a serializer to isolate each signal.

Figure 9:
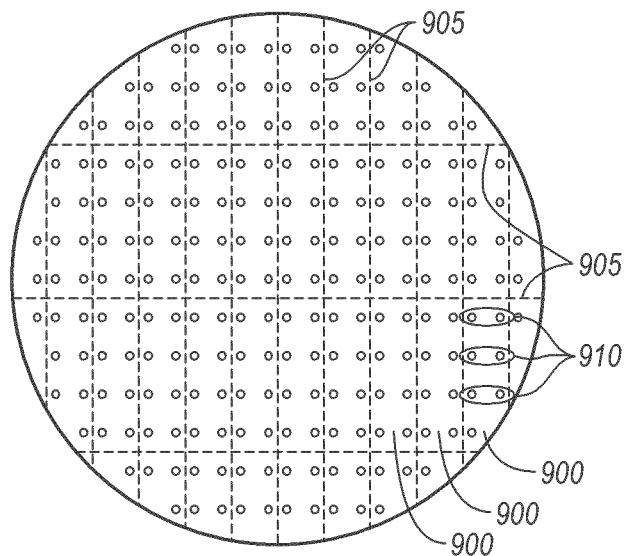
FIG. 9 discloses monolithic opto-isolator arrays manufactured at the wafer level.

Referring to FIG. 9, a wafer is illustrated which includes multiple opto-isolator arrays 900. Dotted lines 905 are illustrated indicating where the wafer will be diced so that each opto-isolator array 900 will subsequently be singulated from the wafer. As discussed above, each opto-isolator 910 of each opto-isolator array 900 can be tested at the wafer level to verify that each opto-isolator 910 functions correctly prior to subsequent manufacturing steps.

Figure 10:
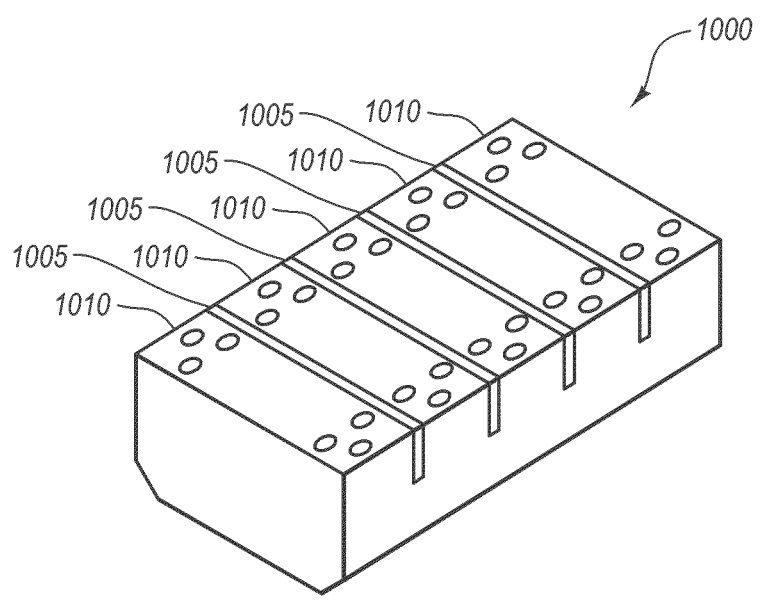
FIG. 10 discloses a monolithic opto-isolator array.

FIG. 10 illustrates an opto-isolator array 1000 after it has been singulated from the wafer in which the various components have been grown and deposited thereon. The opto-isolator array 1000 further includes trenches 1005 in this embodiment between each opto-isolator 1010 to electrically and optically isolate each opto-isolator 1010 of the opto-isolator array 1000. The trenches 1005 are not necessary, however, but may improve isolation between each opto-isolator 1010 of the opto-isolator array 1000.

Figure 11:
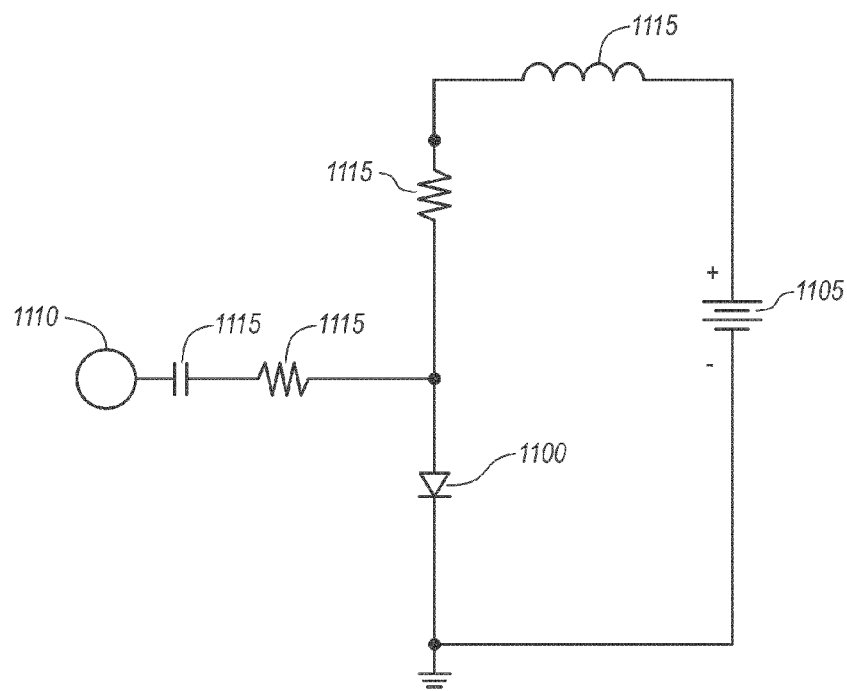
FIG. 11 discloses a schematic illustration of a circuit illustrating how a laser driver may not need to be implemented.

In some embodiments, a laser driver for an opto-isolator may be excluded. For example, referring to FIG. 11, a schematic illustration of a circuit disclosing how a laser driver may not need to be implemented is illustrated. As shown, a VCSEL 1100 an opto-isolator receives a bias current from a power supply 1105. Various combinations of other electronic components 1115 can be implemented to condition the signal. However, the modulation of the VCSEL 1100 is directly controlled by an alternating current (AC) electrical input 1110. For example, the AC electrical input 1110 can be a PECL input, which is an alternating current input. The alternating current input 1110 can be used as the modulation current of the VCSEL 1100 without the requirement of a separate laser driver having an independent modulation current source.

The opto-isolator embodiments discussed herein can be included with any circuitry and/or any electronic device. For example, referring to FIG. 12 an embodiment of an electronic device 1200 is illustrated according to an example embodiment. The electronic device 1200 can include a high-speed optical communications device that may be configured to transfer data at a rate of more than 1 Gigabit per second (Gbps). For example, the high-speed optical communications device may be configured to transfer data at a rate of 10 Gbps or more. The electronic device 1200 can also include testing equipment, a high speed oscilloscope, a computer, a radio, a wireless connection, or other circuitry.

Figure 12:
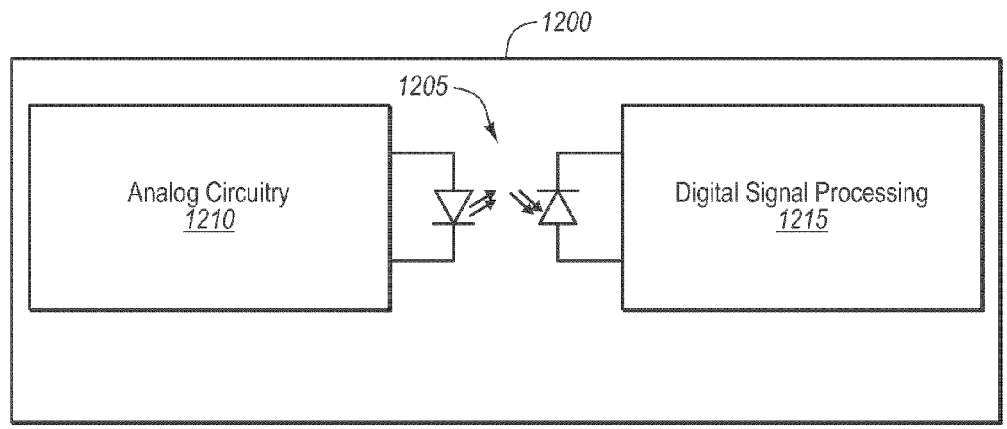
FIG. 12 discloses an electronic device including an opto-isolator.

The electronic device 1200 includes an opto-isolator 1205 according to any of the embodiments disclosed herein as represented schematically in FIG. 12. The opto-isolator 1205 electrically isolates portions of electronic circuits 1210 and 1215 within the electronic device 1200.

Figure 13:
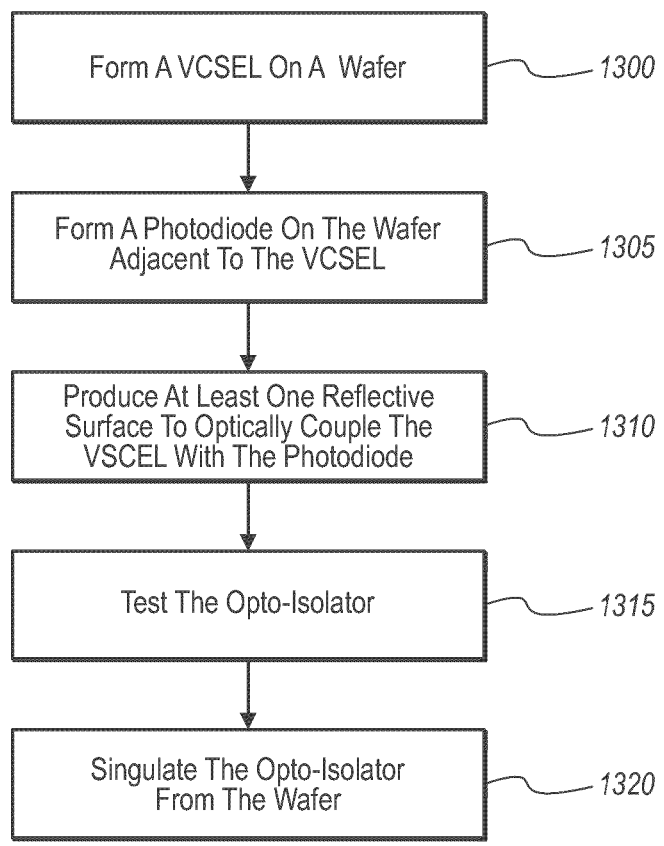
FIG. 13 discloses a method for manufacturing a monolithic opto-isolator according to the teachings herein.

Referring to FIG. 13 a method for manufacturing an opto-isolator is shown. The method includes producing (e.g. by forming or placing) a VCSEL on a semiconductor wafer (1300). The method further includes producing a photodiode on the wafer (1305) where the photodiode is produced adjacent to the VCSEL such that an axis of transmission of the VCSEL is parallel to an axis of reception of the photodiode. One or more reflective surfaces are produced above the wafer and are configured to optically couple the VCSEL with the photodiode (1310). For example, two reflective surfaces can be produced, one reflective surface disposed along the axis of transmission of the VCSEL and one reflective surface disposed along the axis of reception of the photodiode. Each reflective surface can be disposed at an angle of about 45 degrees from the axis of transmission and reception such that a signal transmitted is redirected by a first reflective surface toward a second reflective surface and along the axis of reception toward the optical receiver such as shown in FIGS. 1-7. Each reflective surface can be created using an etching process by etching into the semiconductor wafer or into a material deposed on the semiconductor wafer, such as a post, polymer, or wafer bonded material, as disclosed above.

The opto-isolator may be tested at the wafer level (1315). For example, a test device can provide a current to the VCSEL to generate a signal and the signal generated can be sampled by the photodiode to determine whether the opto-isolator operates according to a performance requirement. Where the opto-isolator does not perform satisfactorily the opto-isolator can be discarded without additional manufacturing processes and packaging.

The opto-isolator can then be singulated from the wafer (1320) using a dicing process. The opto-isolator can also be singulated with other opto-isolators thereby creating a single opto-isolator array circuit. The opto-isolator can be incorporated into an electronic device.

The principles of the embodiments described herein describe the structure and operation of several examples used to illustrate the present invention. It should be understood that the drawings are diagrammatic and schematic representations of such example embodiments and, accordingly, are not limiting of the scope of the present invention, nor are the drawings necessarily drawn to scale. Well-known devices and processes have been excluded so as not to obscure the discussion in details that would be known to one of ordinary skill in the art.

What is claimed is:

1. An opto-isolator, comprising:
    a vertical cavity surface emitting laser (VCSEL) diode comprising a first PN junction with a first p layer and a first n layer;
    a photodiode disposed adjacent to the VCSEL such that an axis of transmission of the VCSEL is parallel to an axis of reception of the photodiode; and
    at least one reflective surface configured to optically couple substantially all of the light produced by the VCSEL with the photodiode.

2. An opto-isolator according to claim 1, wherein the VCSEL and the photodiode are monolithically produced on the same semiconductor wafer.

3. An opto-isolator according to claim 1, wherein the VCSEL and the photodiode are supported by a common substrate.

4. An opto-isolator according to claim 1, wherein the at least one reflective surfaces includes a first reflective surface and a second reflective surface, the first reflective surface disposed along the axis of transmission of the VCSEL at an angle of about 45 degrees to the axis of transmission of the VCSEL, the second reflective surface disposed along the axis of reception of the photodiode and at an angle of about 45 degrees to the axis of reception of the photodiode.

5. An opto-isolator according to claim 1, wherein the at least one reflective surface is etched into a surface of the opto-isolator.

6. An opto-isolator according to claim 5, wherein the surface of the opto-isolator into which the at least one reflective surface is etched includes a semi-conductor material.

7. An opto-isolator according to claim 6, wherein the semiconductor material includes GaAs.

8. An opto-isolator according to claim 1, further comprising a trench located between the VCSEL diode and the photodiode, the trench being configured to increase electrical isolation between the VCSEL diode and the photodiode.

9. An opto-isolator according to claim 8, wherein the trench is filled with a polymer.

10. An opto-isolator according to claim 9, wherein the polymer has a substantially similar index of refraction to GaAs.

11. An opto-isolator according to claim 9, wherein the polymer forms the at least one reflective surface.

12. An opto-isolator according to claim 1, further comprising two VCSEL bond pads configured to provide electrical current to the VCSEL diode; and two photodiode bond pads configured to provide electrical current to the photodiode.

13. An opto-isolator according to claim 1, wherein one of the at least one reflective surfaces is configured to direct light at least partially through air to a second of the at least one reflective surface.

14. An opto-isolator according to claim 1, further comprising a first post, wherein the first post includes a first reflective surface of the at least one reflective surfaces located at a first end of the first post.

15. An opto-isolator according to claim 14, further comprising a second post, wherein the second post includes a second reflective surface of the at least one reflective surfaces at a first end of the second post, wherein a second end of the first post is disposed over the VCSEL and a second end of the second post is disposed over the photodiode.

16. An opto-isolator according to claim 15, wherein the first post is disposed along the axis of transmission of the VCSEL and the second post is disposed along the axis of reception of the photodiode.

17. An opto-isolator according to claim 14, further comprising a first polymeric coating at least partially encasing the VCSEL and the first post.

18. An opto-isolator according to claim 17, further comprising a second polymeric coating at least partially encasing the photodiode and a second post.

19. An opto-isolator according to claim 1, wherein the at least one reflective surface includes a lens for focusing light.

20. An array of opto-isolators comprising a plurality of opto-isolators according to claim 1.

21. An array of opto-isolators according to claim 20, wherein the plurality of opto-isolators are manufactured in a common wafer.

22. An electronic device comprising an opto-isolator according to claim 1.

* * * * *